United States Patent
Tanaka

(10) Patent No.: US 6,770,890 B2
(45) Date of Patent: Aug. 3, 2004

(54) STAGE DEVICES INCLUDING LINEAR MOTORS THAT PRODUCE REDUCED BEAM-PERTURBING STRAY MAGNETIC FIELDS, AND CHARGED-PARTICLE-BEAM MICROLITHOGRAPHY SYSTEMS COMPRISING SAME

(75) Inventor: Keiichi Tanaka, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/318,999

(22) Filed: Dec. 12, 2002

(65) Prior Publication Data

US 2003/0111614 A1 Jun. 19, 2003

(30) Foreign Application Priority Data

Dec. 13, 2001 (JP) ........................................ 2001-379892

(51) Int. Cl.[7] .......................... H01J 37/20; G21K 5/10; H02K 41/02
(52) U.S. Cl. ............................. 250/442.11; 250/440.11; 250/491.1; 250/492.2; 310/12; 318/38; 318/687
(58) Field of Search ....................... 250/442.11, 440.11, 250/491.1, 492.2; 310/12; 318/38, 687

(56) References Cited

U.S. PATENT DOCUMENTS

2003/0155820 A1 * 8/2003 Tominaga et al. ............ 310/12
2003/0226976 A1 * 12/2003 Tanaka ................... 250/442.11

* cited by examiner

*Primary Examiner*—Nikita Wells
(74) *Attorney, Agent, or Firm*—Klarquist Sparkman LLP

(57) ABSTRACT

Stage devices are disclosed that achieve high positioning and movement accuracy while producing substantially reduced outwardly extending stray magnetic fields. The stage devices are especially suitable for use in a charged-particle-beam (CPB) microlithography system because they cause substantially reduced beam perturbations. A stage device comprises multiple linear motors and a slider arranged relative to each other such that the intersection point of drive forces applied by the linear motors to move the slider coincides with the center of gravity of the slider. Each linear motor includes a respective yoke in which permanent magnets are disposed such that pairs of opposing magnets face one another across a gap, each pair of opposing magnets has similarly oriented respective poles, and the orientation is alternatingly reversed in each subsequent pair of opposing magnets in the yoke. Also, the poles of respective opposing pairs of magnets in adjacent yokes are similarly oriented, with the orientation being alternatingly reversed in each subsequent pair in the yokes. Consequently, circuits of magnetic flux are kept tightly confined to the yokes, which substantially reduces interaction of the magnetic flux with the charged particle beam.

20 Claims, 4 Drawing Sheets

US 6,770,890 B2

STAGE DEVICES INCLUDING LINEAR MOTORS THAT PRODUCE REDUCED BEAM-PERTURBING STRAY MAGNETIC FIELDS, AND CHARGED-PARTICLE-BEAM MICROLITHOGRAPHY SYSTEMS COMPRISING SAME

FIELD

This disclosure pertains to stage devices used for moving and positioning an object with extremely high accuracy and precision. Such stage devices are especially suitable for use in microlithography systems that perform transfer-exposure of a pattern, defined on a "master plate" (mask, reticle, or the like, generally termed "reticle" herein) onto an exposure-sensitive substrate (e.g., semiconductor wafer or the like). More specifically, the disclosure pertains to stage devices actuated by a linear motor and that perform highly accurate and precise movements and positionings while generating very low magnetic turbulence, and to microlithography systems including at least one such stage device.

BACKGROUND

Microlithography is a key technique used in the fabrication of microelectronic devices such as displays and semiconductor integrated circuits. Most current microlithography techniques utilize, as a pattern-transfer energy beam, a beam of deep ultraviolet (UV) light propagating through air at normal atmospheric pressure. These deep-UV techniques collectively are termed "optical microlithography."

Other microlithography techniques currently under active development utilize any of various other types of energy beams such as "extreme UV" ("EUV") radiation, X-radiation, and charged particle beams such as an electron beam or ion beam. Microlithography systems utilizing these alternative types of energy beams are being actively developed mainly because they offer prospects of substantially greater pattern-transfer resolution than obtainable with optical microlithography.

In any microlithography system, accurate and precise positioning of the reticle and substrate is extremely important for obtaining maximal pattern-transfer accuracy. Hence, the reticle and substrate are mounted to respective "chucks" on respective "stages." The reticle stage and substrate stage generally are configured to move the reticle chuck and substrate chuck, respectively, in a respective X-Y plane relative to an optical axis extending in the Z-direction. For achieving such motions, the reticle and substrate stages include respective motors or analogous actuators.

Currently, most stage devices used in optical microlithography systems are so-called "H-type" or "I-type" X-Y stages. In both types of stages a movable guide extends in one of the X- and Y-directions between two parallel fixed guides that extend in the other of the X- and Y-directions. The respective chuck is mounted on a platform attached to a slider that moves along and relative to the movable guide. These types of stage devices are so-named because of the overall profile of the two fixed guides and the movable guide in the form of the letter "H" or the letter "I".

Most recently, linear motors have become the actuators of choice for achieving stage motions in the X- and Y-directions. Use of linear motors desirably facilitates reducing the mass and size of each stage, and increases the operational efficiency of the stages. H-type stages are used mainly for substrate stages, which desirably have long respective movements ("strokes") in both of the X- and Y-directions. I-type stages are used mainly for reticle stages, which usually require a long stroke in only one of the X- and Y-directions, and thus have a relatively short stroke in the other of the X- and Y-directions.

For optical microlithography systems, since the energy beam can propagate readily through air at normal atmospheric pressure, the reticle and substrate chucks can be of the "vacuum-suction" type. Also, the respective stages can be supported relative to a guide plate and on their guides by non-contacting "single-sided" fluid bearings (typically air bearings) that provide a high degree of freedom of motion when used with linear motors as actuators.

In contrast, charged-particle-beam (CPB) and extreme ultraviolet (EUV) microlithography must be performed in a vacuum environment because the beam is attenuated greatly in air at normal atmospheric pressure. As a result, reticle and substrate stages that utilize only single-sided fluid bearings (even if the bearings include vacuum-scavenging of bearing fluid) are not feasible, and movements along each guide must be supported by respective fluid bearings on all sides of the guide. The need to provide a respective fluid bearing on each side of the guide greatly complicates use of actuators such as linear motors for moving the stage platform relative to the guides.

As is well known, a linear motor has a "stationary" portion, termed a "stator," and a moving portion, termed a "mover." In an H-type or I-type stage device, as described above, used as a reticle stage or substrate stage in a CPB microlithography system, both the stator and mover of at least one linear motor move along a movement guide. This motion of the entire linear motor causes problematic magnetic-field fluctuations ("magnetic turbulence") in the vicinity of the motor during operation of the stage device. Magnetic turbulence can perturb the trajectory of the beam and thus degrade the quality of microlithographic exposure.

The generation of magnetic turbulence from a conventional linear motor is shown schematically in FIG. 6, which is an elevational depiction. Two opposing permanent magnets 101, 102 of the stator are shown, situated laterally adjacent the trajectory of an electron beam EB. The trajectory is from top to bottom in the figure, and the permanent magnets 101, 102 of the stator are shown vertically aligned with each other beside the electron beam EB. The magnet 101 is disposed so that its S pole faces upward, and the magnet 102 is disposed so that its N pole faces upward. As a result, the respective N poles of each permanent magnet 101, 102, face each other. With such a disposition of the magnets 101, 102, the magnetic flux (dashed line) extending downward from the magnet 101 and the magnetic flux (dashed line) extending upward from the magnet 102 mutually repel and are diverted strongly to the left and right in the figure. Such strong lateral diversion of the magnetic flux causes the flux to reach the beam EB and cause distortion of the beam trajectory, which reduces the accuracy and precision of exposures performed with the beam.

In an actual CPB microlithography apparatus, the charged particle beam is contained in a "beam tube" evacuated to a suitable vacuum, and the beam is deliberately deflected by magnetic fields produced by electromagnetic coils. The beam tube can be configured to provide some protection of the beam from stray magnetic fields from the external environment. Nevertheless, control and reduction of environmental and other stray magnetic fields around the beam tube is especially important in CPB microlithography. As evident in FIG. 6, an important source of stray magnetic fields is a nearby linear motor including permanent magnets arranged as shown in the figure. Whereas it is possible, using magnetic shields, to block stray magnetic fields produced by linear motors, this approach undesirably tends to add substantial complexity to the structure of the overall system.

SUMMARY

In view of the shortcomings of conventional systems as summarized above, the present invention provides, inter alia, a stage device that can position an object (mounted to the stage) with high accuracy and precision, without causing magnetic-field turbulence.

A first aspect of the invention is set forth in the context of a stage device including a guide bar extending along a longitudinal axis, a slider slidably attached to the guide bar in a manner allowing the slider to slide relative to the guide bar along the longitudinal axis, and a stage platform connected to the slider. According to the first aspect, and in such context, actuators are provided for moving the stage platform in a direction parallel to the axis. An embodiment of such an actuator comprises a first linear motor situated on a first side of the guide bar and a second linear motor situated on a second side of the guide bar such that the first and second linear motors are situated in a bilaterally symmetrical manner relative to the axis. Each of the first and second linear motors comprises a respective stator and a respective mover. The respective stators extend parallel to the axis. The respective movers are attached to the slider such that energization of the first and second linear motors causes synchronous movement of the movers relative to the respective stators and thus movement of the slider along the guide bar in the direction of the axis.

In each linear motor the respective stator desirably comprises a respective yoke extending longitudinally parallel to the axis. The yoke is configured to define a channel opening extending parallel to the axis between first and second facing walls of the yoke. Each of the first and second facing walls has attached thereto a respective row of permanent magnets arranged opposite each other and that collectively define a coil-running gap extending parallel to the axis between the opposing rows. The permanent magnets in each row face the permanent magnets in the opposing row across the coil-running gap. The permanent magnets in each row have respective magnetic polarities arranged such that, in a transverse section perpendicular to the axis, the respective magnetic polarity of the permanent magnet on the first facing wall is attractively aligned with the respective magnetic polarity of the permanent magnet on the second facing wall. In a transverse section perpendicular to the axis, the respective magnetic polarities of the opposing permanent magnets on the first and second facing walls of the first linear motor desirably also are attractively aligned with the respective magnetic polarities of the opposing permanent magnets on the first and second facing walls of the second linear motor. Also, in each of the rows of permanent magnets, the magnets desirably are arranged with alternating polarity. By configuring the linear motors in the manner summarized above, magnetic fluxes produced by the permanent magnets are confined sufficiently so as to reduce substantially any leakage of magnetic flux from the stage device.

The yoke desirably has a U-shaped profile in transverse section perpendicular to the axis. In such a configuration, the channel opening is the opening in the "U", and the first and second facing walls are the opposing ends of the "U".

In each of the first and second linear motors, the respective mover desirably comprises a coil mounted to a respective coil-mounting member configured to position the coil in the respective coil-running gap of the respective linear motor. The coil-mounting members can be mounted to a slider plate that is mounted to the slider.

The first and second linear motors desirably apply respective drive forces, to their respective movers, that coincide with a center of gravity of the slider. Thus, pitch and yaw of the stage platform are reduced substantially during movement of the stage. As a result, stage scanning is improved, and the position of the platform is controllable with high accuracy during high-velocity scanning.

According to another aspect of the invention, stage devices are provided. An embodiment of such a stage device comprises a guide means, a slider means, a stage platform, and an actuator means. The guide means extends along a longitudinal axis. The slider means is slidably attached to the guide means in a manner allowing the slider means to move slidably relative to the guide means along the longitudinal axis. The stage platform is connected to the slider means. The actuator means, configured to move the stage platform in a direction parallel to the axis, comprises first and second stators extending parallel to the axis and situated on a first side and a second side, respectively, of the guide means in a bilaterally symmetrical manner relative to the axis. Each of the first and second stators has associated therewith a respective mover attached to the slider means. The movers are configured to exhibit synchronous movement relative to the respective stators, for effecting movement of the slider means along the guide means in the direction of the axis.

Possible specific configurations of the stators and movers of the actuator means are as summarized above.

According to another aspect of the invention, microlithography systems are provided. An embodiment of such a system comprises a reticle stage, an illumination-optical system, a substrate stage, and a projection-optical system. The reticle stage is configured to hold a pattern-defining reticle. The illumination-optical system is situated upstream of the reticle stage and is configured to direct an illumination beam onto a selected region of the reticle. The substrate stage is situated downstream of the reticle stage and is configured to hold an exposure-sensitive substrate. The projection-optical system is situated between the reticle stage and the substrate stage and is configured to direct a patterned beam from the illuminated region of the reticle to a selected imaging location on the substrate. At least one of the reticle stage and substrate stage comprises an actuator as summarized above, or is configured as a stage device as summarized above.

The foregoing and additional features and advantages of the invention will be more readily apparent from the following detailed description, which proceeds with reference to the accompanying drawings.

DETAILED DESCRIPTION

Various aspects and details of the invention are set forth in the context of representative embodiments that are not intended to be limiting in any way. Also, the embodiments are described in the context of an electron-beam microlithography system as a representative charged-particle-beam (CPB) microlithography system. However, it will be understood that the principles of the invention are applicable to any of various other microlithography systems, including ion-beam systems, EUV systems, and other systems requiring a vacuum chamber for establishing a suitable propagation environment for a beam that is sensitive to the effects of a stray magnetic field.

Figure 5:
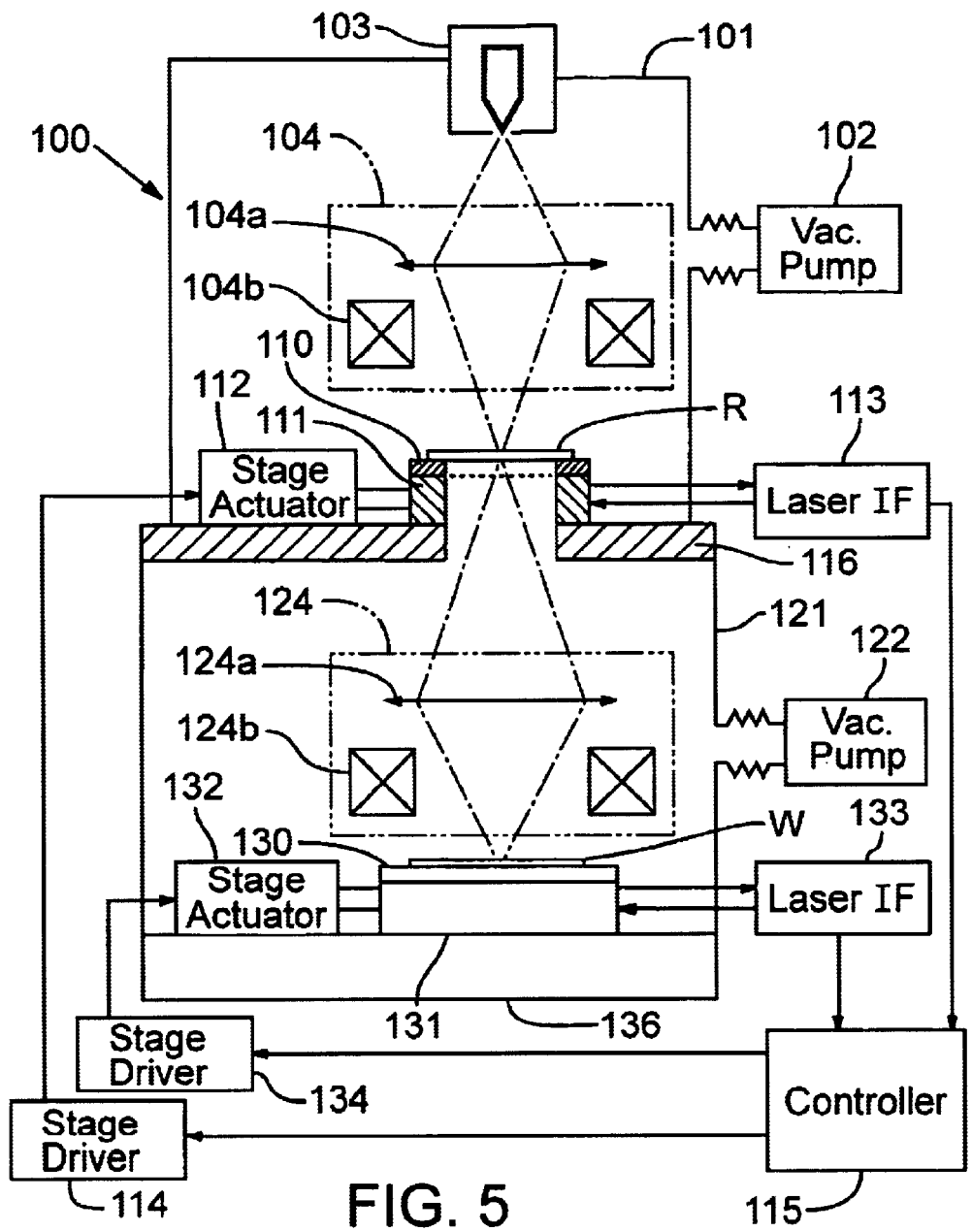
FIG. 5 is an elevational schematic diagram of the overall configuration of an electron-beam microlithography system including a stage according to the representative embodiment.
Figure 6:
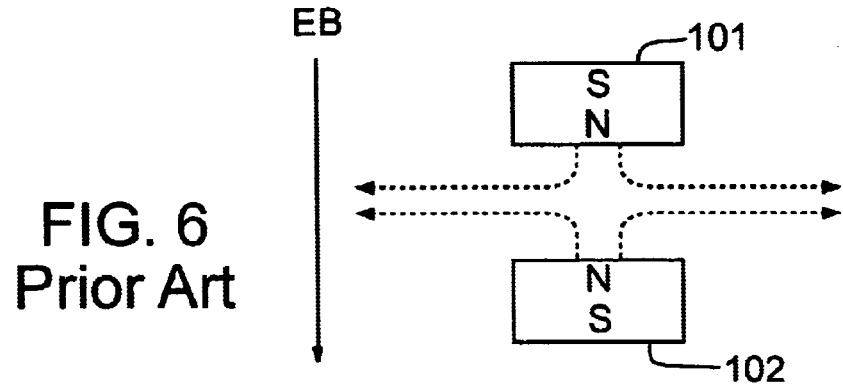
FIG. 6 is a schematic elevational view depicting outwardly extending magnetic fields produced by the stator of a linear motor on a conventional stage device. The outwardly extending fields from a moving linear motor produce a fluctuating magnetic field ("magnetic turbulence") that perturbs the electron beam incident on an object being held by the stage device.

An embodiment of an electron-beam microlithography system 100, comprising at least one stage device, is shown schematically as an elevational view in FIG. 5. The "upper" portion of the system 100 is enclosed in a "lens column" (first vacuum chamber) 111 to which a vacuum pump 102 is connected. The vacuum pump 102 evacuates the lens column 101 to a suitable vacuum level.

An electron gun 103 is disposed at the upstream end of the lens column 101 and emits an electron beam that propagates in a downstream direction (downward in the figure). Downstream of the electron gun 103 are an illumination-optical system 104 (comprising a condenser lens 104a and deflector 104b, etc.) and a reticle R. The electron beam emitted from the electron gun 103 is converged by the condenser lens 104a. The electron beam is scanned in the lateral direction in the drawing by the deflector 104b so as to illuminate a row of multiple individual exposure units ("subfields") of the reticle R in a scanning, sequential manner. The length of the row is approximately equal to the width of the optical field of the illumination-optical system 104. Although in the figure the illumination-optical system 104 is depicted as having a single condenser lens 104a, it will be understood that an actual illumination-optical system comprises multiple condenser lenses, multiple deflectors, a beam-shaping aperture, a blanking aperture, and other components.

The reticle R is secured to a chuck 110, mounted to an upper surface of a reticle stage 111, by electrostatic adhesion or the like. The reticle stage 111 is mounted on a mounting plate 116, relative to which the reticle stage 111 is movable.

The reticle stage 111 is connected to a stage actuator 112 (shown at left in the figure). (In an actual reticle stage 111, the actuator 112 is incorporated into the stage 111, as shown for example in FIG. 1.) The actuator 112 comprises at least one linear motor and/or other moving means configured for moving the reticle stage 111 relative to the mounting plate 116. The actuator 112 is connected to a controller 115 via a respective stage driver 114, the latter comprising electronic circuitry required for driving the actuator 112. Also associated with the reticle stage 111 is a respective laser interferometer (IF) 113 (situated on the right in the figure). The laser interferometer 113 serves to provide accurate data concerning the position of the reticle stage 111. The data are routed to the controller 115 to which the laser interferometer 113 is connected. The controller 115 processes the data and routes commands to the stage driver 114 as required to cause the actuator 112 to position the reticle stage 111 at a desired or appropriate target position. Thus, the position of the reticle stage 111 is feedback-controlled accurately and in real time.

A substrate chamber (second vacuum chamber) 121 is situated downstream of the mounting plate 116 and is connected to a respective vacuum pump 122. The vacuum pump 122 evacuates the substrate chamber 121 to a desired vacuum level. Situated inside the substrate chamber 121 is a projection-optical system 124 that includes a projection lens 124a and a deflector 124b. Although in the figure the projection-optical system 124 is depicted as having a single projection lens 104a, it will be understood that an actual projection-optical system comprises multiple projection lenses, multiple deflectors, apertures, and other components, including components used for aberration correction. Also situated inside the substrate chamber, downstream of the projection-optical system 124, is a substrate stage 131 to which an exposure-sensitive substrate (typically a resist-coated wafer) W is mounted for exposure.

The portion of the electron beam passing through the reticle R is patterned by such passage, and thus the beam propagating downstream of the reticle R carries an aerial image of the illuminated region of the reticle R. This "patterned" beam is converged by the condenser lens 124a and deflected as required by the deflector 124b so as to form a focused actual image of the illuminated region of the reticle R at a predetermined position on the substrate W.

The substrate W is secured to a chuck 130, mounted to an "upper" surface of a substrate stage 131, by electrostatic adhesion or the like. The substrate stage 131 is mounted on a mounting plate 136, relative to which the substrate stage 131 is movable.

The substrate stage 131 is connected to a stage actuator 132 (shown at left in the figure). (In an actual substrate stage 131, the actuator 132 is incorporated into the stage 131, as shown for example in FIG. 1.) The actuator 132 comprises linear motors and/or other moving means configured for moving the substrate stage 131 relative to the mounting plate 136. The actuator 132 is connected to the controller 115 via a respective stage driver 134, the latter comprising electronic circuitry required for driving the actuator 132. Also associated with the substrate stage 131 is a respective laser interferometer (IF) 133 (situated on the right in the figure). The laser interferometer 133 serves to provide accurate data concerning the position of the substrate stage 131. The data are routed to the controller 115 to which the laser interferometer 133 is connected. The controller 115 processes the data and routes commands to the stage driver 134 as required to cause the actuator 123 to position the substrate stage 131 at a desired or appropriate target position. Thus, the position of the substrate stage 131 is feedback-controlled accurately and in real time.

Figure 4A:
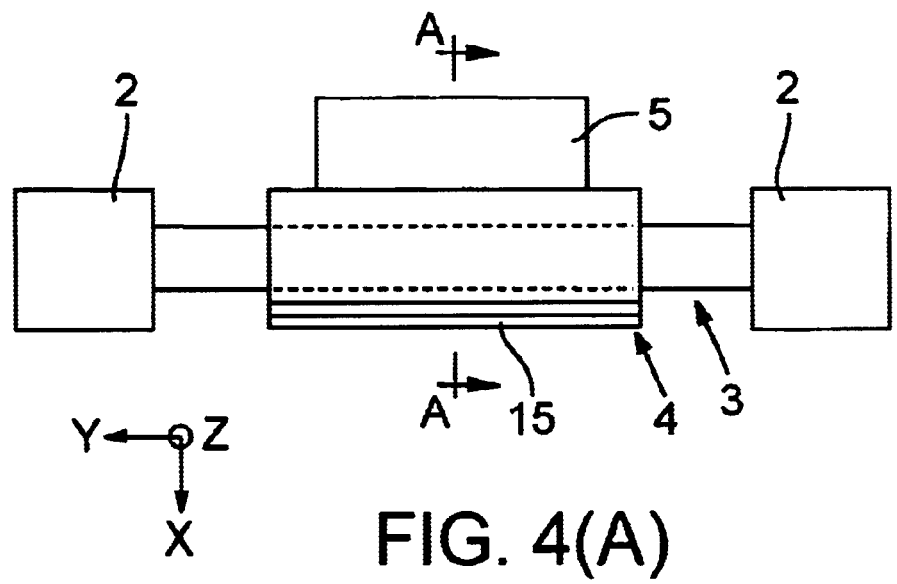
FIG. 4(A) is a plan view of the stage device of the representative embodiment.
Figure 4B:
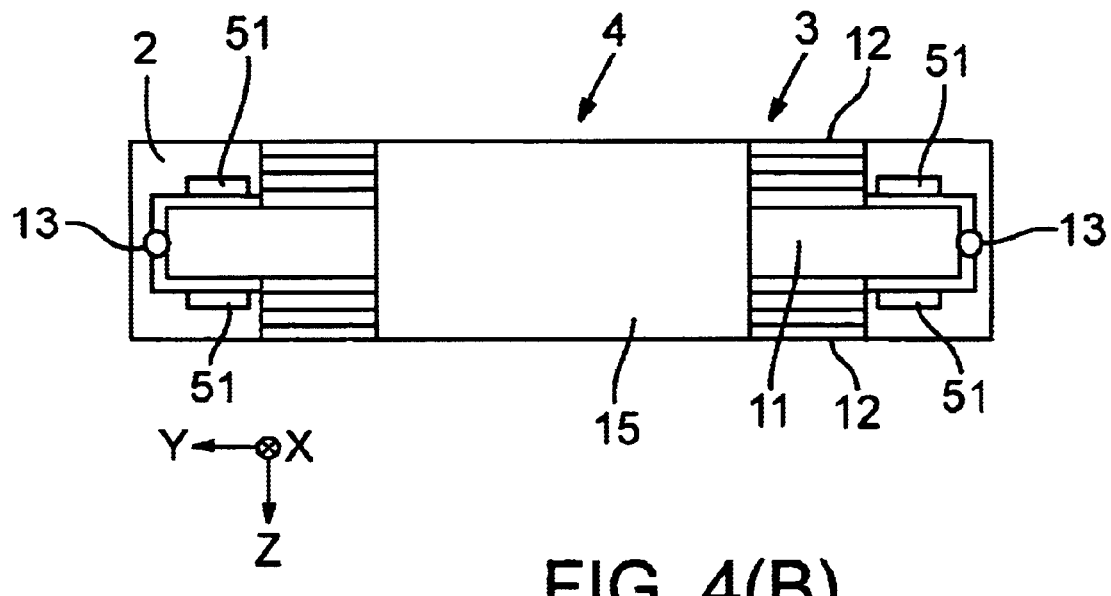
FIG. 4(B) is an orthogonal view of the stage device of FIG. 4(A).

A representative embodiment of a stage device is shown in FIGS. 4(A)–4(B), wherein FIG. 4(A) is a plan view and FIG. 4(B) is an orthogonal elevational view of the device. The depicted stage device is configured for movement of a platform 5 in the Y-direction. In FIG. 4(A), a fixed guide 3 extends in the Y-direction and is secured on each end thereof to a mounting plate (not shown, but see item 136 in FIG. 5) by respective guide-fixing members 2. A slider 4 is slidably engaged with the fixed guide 3 via a fluid bearing (not shown but well understood in the art) allowing the slider 4 to move in the Y-direction relative to the fixed guide 3. The platform 5 is attached to and extends from the slider 4 and is configured to hold a reticle or substrate. To such end, a chuck (not shown) is mounted to the platform 5, and the chuck holds the reticle or substrate.

Turning now to FIG. 4(B), the fixed guide 3 comprises a central guide bar 11 and yokes 12 disposed "above" and "below" the central guide bar 11 (see FIGS. 1 and 2 and discussion below). Each end of the central guide bar 11 is secured to a respective guide-fixing member 2 via a respective bearing 13 and fluid bearings 51. The fluid bearings 51, desirably configured as air bearings, are provided at the "upper" and "lower" zones of contact of each guide-fixing member 2 with the respective end of the central guide bar 11. Each fluid bearing 51 desirably is circumscribed peripherally by a groove ("guard ring"; not shown but well understood in the art). The fluid bearings 51 support the central guide bar 11 "above" and "below" and maintain central placement of the central guide bar 11 relative to each guide-fixing member 2. The yoke 12 has a U-shaped profile in X-section and is elongated in the Y-direction. The "U" opens in the X-direction facing away from the platform 5. The slider 4 engages the central guide bar 11 via a fluid bearing (desirably an air bearing).

Figure 1:
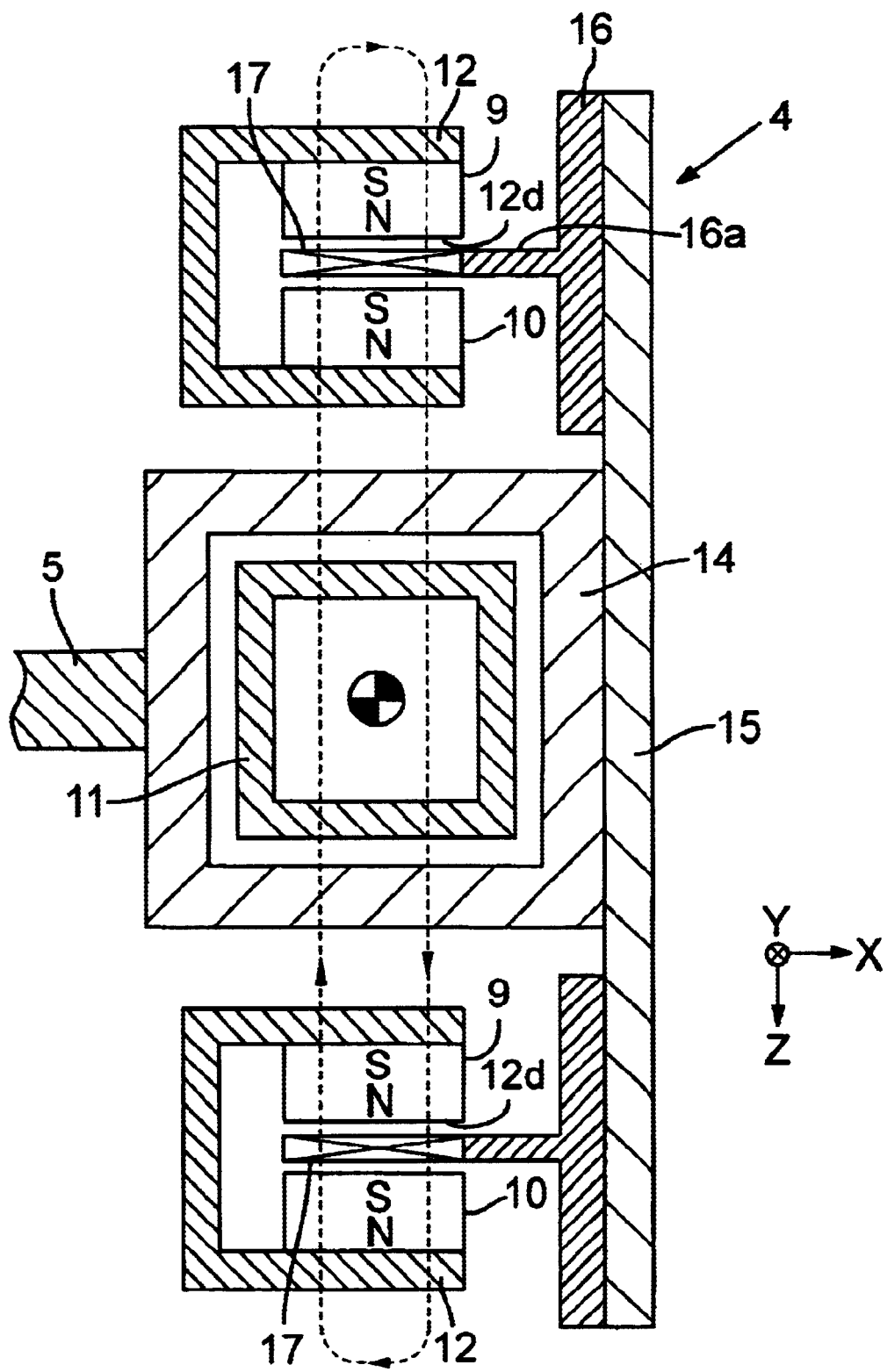
FIG. 1 is a section in the X-Z plane through a linear motor of a stage device according to a representative embodiment.

FIG. 1 is an elevational section (in the X-Z plane) of the stage device, showing further detail regarding the linear motors of the stage device. More specifically, FIG. 1 is an elevational section along the line A—A in FIG. 4(A). Shown are the slider 4, the central guide bar 11, the yokes 12, and the platform 5. The slider 4 comprises a cylinder 14 having a quadrilateral cross-section in FIG. 1. The cylinder 14 surrounds the central guide bar 11 and is spaced from the central guide bar 11 by respective fluid bearings (not shown) to allow frictionless movement of the cylinder 14 relative to the central guide bar 11. Attached to the cylinder 14 (on the right side in the figure) is a slider plate 15 having a defined thickness and mass. The platform 5 is attached to and extends from the opposite side of the cylinder 14.

Attached to the "upper" and "lower" portions of the slider plate are respective coil-mounting members 16 that extend in the Y-direction and have respective T-shaped sectional profiles in the X-Z plane. The stem of each T-shaped profile extends away in the -X-direction (to the left in the figure) from the slider plate 15. Mounted distally to the stem of each coil-mounting member 16 is a respective moving coil (mover) 17.

Each mover 17 extends into the U-shaped X-Z profile of the respective yoke 12. Each yoke 12 is made of, e.g., carbon steel or the like. Each yoke 12 extends in the Y-direction and has a U-shaped section in the X-Z plane. Permanent magnets 9, 10 are mounted to the inner walls of each yoke 12 so as to face each other across the opening in the U-shaped section of the yoke. Each yoke 12 with its permanent magnets 9, 10 constitutes a respective magnetic-flux circuit in the X-Z plane. Each pair of permanent magnets 9, 10 is disposed such that their S poles face upward and their N poles face downward in the figure. Thus, these magnets 9, 10 have their poles "attractively" aligned with each other. A gap ("coil-running" gap 12d) is defined between the respective N and S poles of opposing permanent magnets 9, 10, and is the space in which the respective mover 17 is disposed and moves relative to the respective yoke 12.

Whenever the permanent magnets 9, 10 are disposed in the manner described above, magnetic flux proceeding from the N pole of the "uppermost" permanent magnet 9 heads "downward" to the S pole of the opposing permanent magnet 10 in the "upper" yoke 12. Similarly, magnetic flux proceeding from the N pole of this permanent magnet 10 heads "downward" to the S pole of the permanent magnet 9 in the "lower" yoke 12 (i.e., the permanent magnet 9 that is directly "below" the cylinder 14). This magnetic flux is indicated by a broken line. Also, magnetic flux proceeding from the N pole of the permanent magnet 9 heads "downward" to the S pole of the opposing permanent magnet 10 in the "lower" yoke 12. This magnetic flux then loops relative to the "lowest" permanent magnet 10 and proceeds upward from the S pole of the "lowest" permanent magnet 10 to the N pole of the opposing permanent magnet 9 in the "lower" yoke 12. The magnetic flux further proceeds from the S pole of the permanent magnet 9 in the "lower" yoke 12 to the N pole of the permanent magnet 10 in the "upper" yoke 12 ("above" the cylinder 14), and further proceeds from the S pole of the permanent magnet 10 in the "upper" yoke 12 to the N pole of the permanent magnet 9 in the "upper" yoke 12. This magnetic flux then loops relative to the "uppermost" permanent magnet 9, thereby completing the magnetic-flux circuit. By creating such a circuit with magnets having respective polarities that are attractively aligned with each other, the magnetic flux produced by the four permanent magnets 9, 10 shown in the figure is confined and thus resists leaking outward.

Each yoke 12 and respective permanent magnets 9, 10 constitute a stator of a respective linear motor used for driving the platform 5 in the Y-direction. Each linear motor also includes the respective mover 17 that serves as the "rotor" of the linear motor. As can be ascertained from FIG. 1, by placing respective linear motors "above" and "below" the central guide bar 11, the respective drive forces produced by the linear motors coincide nearly exactly with the center of gravity of the slider 4. By applying the drive forces collectively to the center of gravity in this manner, the position of the center of gravity can be controlled with high accuracy and precision, even during high-velocity stage movements. Although not shown in thee figure, electrical wires for delivering electrical current and hydraulic conduits for delivering liquid coolant to the moving members 17 are attached to the slider 4.

Figure 2:
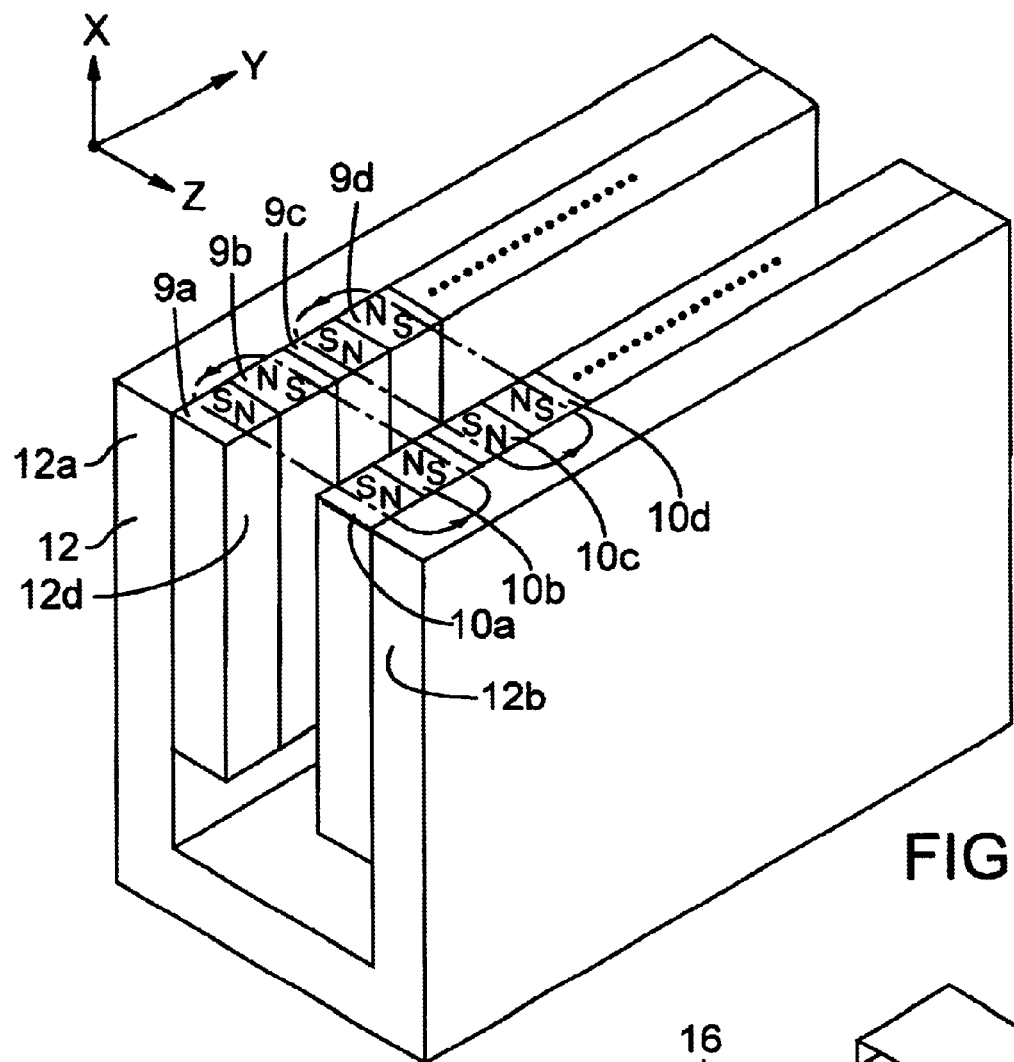
FIG. 2 is an oblique view of a stator of the linear motor of FIG. 1, showing especially the arrangement of permanent magnets in a yoke of the stator and magnetic flux circuits (in respective Y-Z planes) produced by the magnets.

Further details of the yoke 12 and permanent magnets 9, 10 are shown in the oblique view of FIG. 2. In the view of FIG. 2 the opening in the yoke 12 defined by yoke walls 12a, 12b faces "upward." Multiple permanent magnets 9a, 9b, 9c, 9d, . . . , 9n are arrayed in a row along and attached to the inner wall surface of the yoke wall 12a. Similarly, multiple permanent magnets 10a, 10b, 10c, 10d, . . . , 10n are arrayed in a row along and attached to the inner wall surface of the yoke wall 12b. Thus, the magnets 9a, 9b, 9c, 9d, . . . , 9n face respective magnets 10a, 10b, 10c, 10d, . . . , 10n across the opening. Also, the permanent magnets 9a, 10a face each other such that the N pole of the magnet 9a faces the S pole of the magnet 10a across the coil-running gap 12d. Thus, the respective polarities of these magnets 9a, 10a are attractively aligned with each other. Similarly, the permanent magnets 9b, 10b face each other such that the S pole of the magnet 9b faces the N pole of the magnet 10b across the coil-running gap 12d. Similarly, the permanent magnets 9c, 10c face each other such that the N pole of the magnet 9c faces the S pole of the magnet 10c, and the permanent magnets 9d, 10d face each other such that the S pole of the magnet 9d faces the N pole of the magnet 10d across the coil-running gap 12d. Thus, each opposing pair of magnets has respective polarities that are attractively aligned. Also, as shown, in each row the permanent magnets are arranged with alternating polarity.

FIG. 2 also shows that a magnetic-flux circuit (dashed line) is established in the Y-Z plane from the N pole of the magnet 9a across the coil-running gap 12d to the S pole of the magnet 10a, from the N pole of the magnet 10a to the S pole of the adjacent magnet 10b, from the N pole of the magnet 10b across the coil-running gap 12d to the S pole of the magnet 9b, and from the N pole of the magnet 9b to the S pole of the adjacent magnet 9a. Similarly, a magnetic-flux circuit (dashed line) is established in the Y-Z plane from the N pole of the magnet 9c across the coil-running gap 12d to the S pole of the magnet 10c, from the N pole of the magnet 10c to the S pole of the adjacent magnet 10d, from the N pole of the magnet 10d across the coil-running gap 12d to the S pole of the magnet 9d, and from the N pole of the magnet 9d to the S pole of the adjacent magnet 9c. These magnetic-flux circuits established by respective sets of four permanent magnets are highly confined and resist leaking exteriorly.

Figure 3:
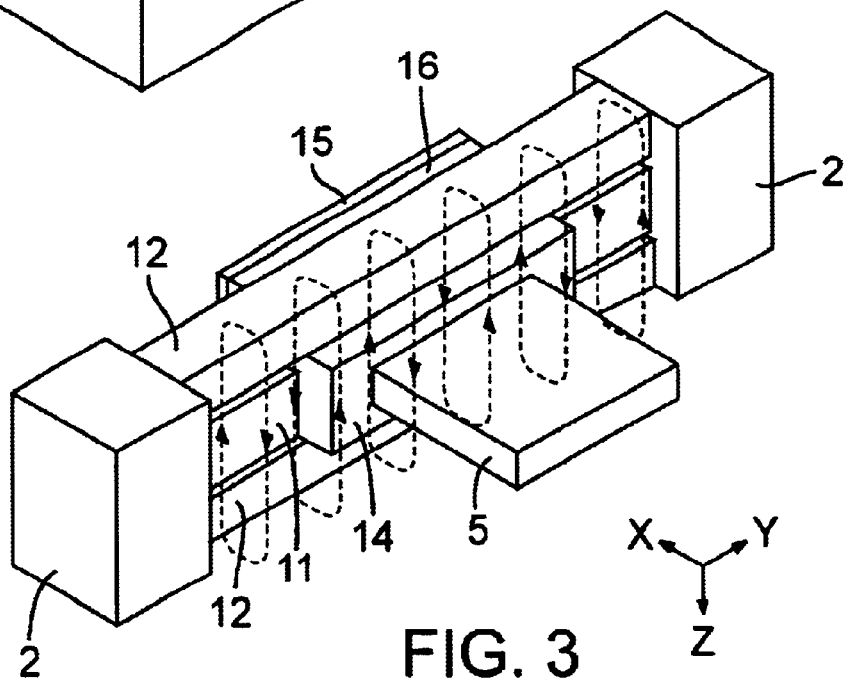
FIG. 3 is an oblique view of the stage device of FIG. 1, showing especially the magnetic flux circuits (in respective X-Z planes) collectively produced by the permanent magnets in the yokes.

FIG. 3 is an oblique view of the stage device of FIGS. 4(A)–4(B). The yoke 12 comprising multiple permanent magnets, as shown in FIG. 2, extends "above" and "below" the slider 14. The platform 5 is attached to the slider 14 in the center of the figure. Also shown are magnetic-flux lines (dashed lines), similar to the flux line shown in FIG. 1, circulating in the vicinity of the upper and lower yokes 12. As discussed above, the permanent magnets in the yokes 12 are arranged in the Z-direction such that, in each group of four magnets (e.g., magnets 9 and 10 in the upper yoke 12 and magnets 9 and 10 in the lower yoke 12 in FIG. 1) opposite poles face one another. (In other words, opposing pairs of magnets have respective polarities that are attractively aligned.) Such an arrangement creates tight circuits of magnetic flux that are confined in the XZ plane, and thus tend not to leak outwardly.

Meanwhile, as indicated in FIG. 2, the N and S poles of the permanent magnet 9a in the yoke 12 are situated adjacent the S and N poles, respectively, of the permanent magnet 9b. Similarly, the N and S poles of the permanent magnet 10a are situated adjacent the S and N poles, respectively, of the permanent magnet 10b. This arrangement of alternating polarity of adjacent magnets continues with the remaining magnets in the yoke 12. As a result of this arrangement, inside the "upper" and "lower" yokes 12 in FIG. 3 and in the X-Z plane, the direction of magnetic flux produced by the permanent magnets 9a, 10a is opposite the direction of magnetic flux produced by the permanent magnets 9b, 10b. This alternation of flux direction continues with the remaining magnets in the yoke 12 (in FIG. 3 note alternating directions of arrows associated with respective adjacent magnetic-flux circuits), and tends to form tight circuits of magnetic flux that tend not to leak outwardly.

Therefore, a stage comprising a linear motor in which the permanent magnets are arranged as described above provides highly accurate stage movements and positionings, while producing very little magnetic field extending sufficiently far from the linear motor to perturb the charged particle beam.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a stage device including a guide bar extending along a longitudinal axis, a slider slidably attached to the guide bar in a manner allowing the slider to slide relative to the guide bar along the longitudinal axis, and a stage platform connected to the slider, an actuator for moving the stage platform in a direction parallel to the axis, the actuator comprising:

a first linear motor situated on a first side of the guide bar and a second linear motor situated on a second side of the guide bar such that the first and second linear motors are situated in a bilaterally symmetrical manner relative to the axis; and each of the first and second linear motors comprising a respective stator and a respective mover, the respective stators extending parallel to the axis, and the respective movers being attached to the slider such that energization of the first and second linear motors causes synchronous movement of the movers relative to the respective stators and thus movement of the slider along the guide bar in the direction of the axis.

2. The actuator of claim 1, wherein, in each linear motor:

the respective stator comprises a respective yoke extending longitudinally parallel to the axis, the yoke being configured to define a channel opening extending parallel to the axis between first and second facing walls of the yoke;

each of the first and second facing walls has attached thereto a respective row of permanent magnets arranged opposite each other and that collectively define a coil-running gap extending parallel to the axis between the opposing rows, wherein the permanent magnets in each row face the permanent magnets in the opposing row across the coil-running gap; and the permanent magnets in each row having respective magnetic polarities arranged such that, in a transverse section perpendicular to the axis, the respective magnetic polarity of the permanent magnet on the first facing wall is attractively aligned with the respective magnetic polarity of the permanent magnet on the second facing wall.

3. The actuator of claim 2, wherein, in a transverse section perpendicular to the axis, the respective magnetic polarities of the opposing permanent magnets on the first and second facing walls of the first linear motor additionally are attractively aligned with the respective magnetic polarities of the opposing permanent magnets on the first and second facing walls of the second linear motor.

4. The actuator of claim 3, wherein, in each of the rows of permanent magnets, the magnets are arranged with alternating polarity.

5. The actuator of claim 2, wherein, in each of the rows of permanent magnets, the magnets are arranged with alternating polarity.

6. The actuator of claim 2, wherein the yoke is U-shaped in a transverse section perpendicular to the axis.

7. The actuator of claim 2, wherein, in each of the first and second linear motors, the respective mover comprises a coil mounted to a respective coil-mounting member configured to position the coil in the respective coil-running gap of the respective linear motor.

8. The actuator of claim 7, wherein the coil-mounting members are mounted to a slider plate that is mounted to the slider.

9. The actuator of claim 1, wherein the first and second linear motors apply respective drive forces, to their respective movers, that coincide with a center of gravity of the slider.

10. A microlithography system, comprising:

a reticle stage configured to hold a pattern-defining reticle;

an illumination-optical system situated upstream of the reticle stage and configured to direct an illumination beam onto a selected region of the reticle;

a substrate stage situated downstream of the reticle stage and configured to hold an exposure-sensitive substrate; and a projection-optical system situated between the reticle stage and the substrate stage and configured to direct a patterned beam from the illuminated region of the reticle to a selected imaging location on the substrate, wherein at least one of the reticle stage and substrate stage comprises an actuator as recited in claim 1.

11. A stage device, comprising:

a guide means extending along a longitudinal axis;

a slider means slidably attached to the guide means in a manner allowing the slider means to move slidably relative to the guide means along the longitudinal axis;

a stage platform connected to the slider means; and an actuator means for moving the stage platform in a direction parallel to the axis, the actuator means comprising first and second stators extending parallel to the axis and situated on a first side and a second side, respectively, of the guide means in a bilaterally symmetrical manner relative to the axis, each of the first and second stators having associated therewith a respective mover attached to the slider means, the movers being configured to exhibit synchronous movement relative to the respective stators to effect movement of the slider means along the guide means in the direction of the axis.

12. The stage device of claim 11, wherein:

each stator comprises a respective yoke extending longitudinally parallel to the axis, the yoke being configured to define a channel opening extending parallel to the axis between first and second facing walls of the yoke;

each of the first and second facing walls has attached thereto a respective row of permanent magnets arranged opposite each other and that collectively define a coil-running gap extending parallel to the axis between the opposing rows, wherein the permanent magnets in each row face the permanent magnets in the opposing row across the coil-running gap; and the permanent magnets in each row have respective magnetic polarities arranged such that, in a transverse section perpendicular to the axis, the respective magnetic polarity of the permanent magnet on the first facing wall is attractively aligned with the respective magnetic polarity of the permanent magnet on the second facing wall.

13. The stage device of claim 12, wherein, in a transverse section perpendicular to the axis, the respective magnetic polarities of the opposing permanent magnets on the first and second facing walls of the yoke of the first stator additionally are attractively aligned with the respective magnetic polarities of the opposing permanent magnets on the first and second facing walls of the yoke of the second stator.

14. The stage device of claim 13, wherein, in each of the rows of permanent magnets, the magnets are arranged with alternating polarity.

15. The stage device of claim 12, wherein, in each of the rows of permanent magnets, the magnets are arranged with alternating polarity.

16. The stage device of claim 12, wherein each yoke is U-shaped in a transverse section perpendicular to the axis.

17. The stage device of claim 12, wherein, associated with each of the first and second stators, the respective mover comprises a coil mounted to a respective coil-mounting member configured to position the coil in the respective coil-running gap of the respective stator.

18. The stage device of claim 17, wherein the coil-mounting members are mounted to a slider plate that is mounted to the slider means.

19. The stage device of claim 11, wherein the first and second stators and associated movers apply respective drive forces to the slider means, the drive forces coinciding with a center of gravity of the slider means.

20. A microlithography system, comprising:

a reticle stage configured to hold a pattern-defining reticle;

an illumination-optical system situated upstream of the reticle stage and configured to direct an illumination beam onto a selected region of the reticle;

a substrate stage situated downstream of the reticle stage and configured to hold an exposure-sensitive substrate; and a projection-optical system situated between the reticle stage and the substrate stage and configured to direct a patterned beam from the illuminated region of the reticle to a selected imaging location on the substrate, wherein at least one of the reticle stage and substrate stage is configured as the stage device recited in claim 11.

* * * * *

UNITED STATES PATENT AND TRADEMARK OFFICE
CERTIFICATE OF CORRECTION

PATENT NO. : 6,770,890 B2
DATED : August 3, 2004
INVENTOR(S) : Keiichi Tanaka

It is certified that error appears in the above-identified patent and that said Letters Patent is hereby corrected as shown below:

Column 5,
Line 30, "111" should read -- 101 --.

Column 6,
Line 16, "104a," should read -- 124a, --.
Line 54, "123" should read -- 132 --.

Column 8,
Line 38, "thee" should read -- the --.

Column 9,
Line 33, "XZ" should read -- X-Z --.

Signed and Sealed this

Twenty-sixth Day of April, 2005

JON W. DUDAS
*Director of the United States Patent and Trademark Office*